United States Patent
Cho et al.

(10) Patent No.: US 10,069,501 B2
(45) Date of Patent: Sep. 4, 2018

(54) SET POINT ADJUSTER FOR OSCILLATOR DRIVER

(71) Applicant: TEXAS INSTRUMENTS INCORPORATED, Dallas, TX (US)

(72) Inventors: Kunhee Cho, Austin, TX (US);
Danielle Griffith, Richardson, TX (US);
James Murdock, Richardson, TX (US);
Per Torstein Roine, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/070,810

(22) Filed: Mar. 15, 2016

(65) Prior Publication Data

US 2017/0272084 A1   Sep. 21, 2017

(51) Int. Cl.
| | |
|---|---|
| *H03L 7/099* | (2006.01) |
| *H03L 5/00* | (2006.01) |
| *H03B 5/00* | (2006.01) |
| *H03B 1/00* | (2006.01) |
| *H03B 5/08* | (2006.01) |
| *H03B 5/32* | (2006.01) |
| *H04W 84/18* | (2009.01) |
| *H03B 5/36* | (2006.01) |

(52) U.S. Cl.
CPC ............... *H03L 5/00* (2013.01); *H03B 1/00* (2013.01); *H03B 5/00* (2013.01); *H03B 5/08* (2013.01); *H03B 5/32* (2013.01); *H03B 5/36* (2013.01); *H03L 7/099* (2013.01); *H04W 84/18* (2013.01); *H03B 2201/031* (2013.01)

(58) Field of Classification Search
CPC ... H03B 1/00; H03B 5/36; H03B 5/08; H03B 5/32; H03L 7/099; H03L 5/00; G05F 1/56; H04W 84/18
USPC ......... 331/167, 158, 116 FE, 116 R, 117 FE, 331/117 R, 185; 323/282
See application file for complete search history.

(56) References Cited

U.S. PATENT DOCUMENTS 6,046,648 A * 4/2000 Nakamiya ................. G04F 5/06
                                                          331/116 FE
6,411,169 B1 * 6/2002 Yabe ......................... G04F 5/06
                                                          331/116 FE

* cited by examiner

*Primary Examiner* — Arnold Kinkead
(74) *Attorney, Agent, or Firm* — Gregory J. Albin; Charles A. Brill; Frank D. Cimino

(57) ABSTRACT

A circuit includes an oscillator having a driver and a resonator. The driver receives a supply voltage at a supply input and provides a drive output to drive the resonator to generate an oscillator output signal. A power converter receives an input voltage and generates the supply voltage to the supply input of the driver. The power converter varies the supply voltage based on an adjust command supplied to a command input of the power converter. A detector monitors a voltage level of the oscillator output signal. A controller sets the adjust command to the power converter to control the supply voltage to the supply input of the driver such that the voltage level of the oscillator output signal is set at or above a predetermined threshold voltage.

16 Claims, 5 Drawing Sheets

SET POINT ADJUSTER FOR OSCILLATOR DRIVER

TECHNICAL FIELD

This disclosure relates to integrated circuits and more particularly to a set point adjuster for an oscillator driver.

BACKGROUND

A wireless sensor network (WSN) (sometimes referred to as a wireless sensor and actuator network (WSAN)) are spatially distributed autonomous sensors or nodes to monitor/control physical or environmental conditions such as temperature, sound, pressure and so forth. Sensors or actuators on the network cooperatively pass collected data through the network to a central location where data is analyzed and stored and/or commands sent to operate the respective network nodes. Many networks are bi-directional, and thus also enable control of sensor activity. These networks and nodes are used in many industrial and consumer applications such as industrial process monitoring and control, machine health monitoring, and so forth. One important factor for operating nodes on the network is for very low power consumption.

Power consumption in such networks is an important factor as the devices employed at each node are relatively inexpensive and often times operate from battery power. One manner in which to reduce the power of low power wireless networks is to have intermittent data transfer (burst operation) when sending and receiving data to the nodes. Sleep timers are sometimes employed to synchronize the burst operations. Since the sleep timer is usually always ON, the sleep timer needs to be both very low power and very accurate for lowest system power. However, conventional crystal oscillator drivers in the sleep timers can have large power losses based on process variations in the timer circuit and thus can cause high power consumption which reduces battery lifetime.

SUMMARY

This disclosure relates to a set point adjuster for an oscillator driver. In one example, a circuit includes an oscillator having a driver and a resonator. The driver receives a supply voltage at a supply input and provides a drive output to drive the resonator to generate an oscillator output signal. A power converter receives an input voltage and generates the supply voltage to the supply input of the driver. The power converter varies the supply voltage based on an adjust command supplied to a command input of the power converter. A detector monitors a voltage level of the oscillator output signal. A controller sets the adjust command to the power converter to control the supply voltage to the supply input of the driver such that the voltage level of the oscillator output signal is set at or above a predetermined threshold voltage.

In another example, a method includes monitoring a voltage level of an oscillator output signal. The oscillator output signal is generated by an oscillator having a resonator and a driver. The method includes comparing the voltage level of the oscillator output signal to a predetermined minimum threshold voltage. The method includes controlling a supply input voltage to the driver such that the voltage level of the oscillator output signal is set at or above the predetermined minimum threshold voltage.

In yet another example, a remote sensor device that includes a radio circuit to communicate with the device via a wireless network connection. The remote sensor device includes a timing circuit to operate the device. The timing circuit includes an oscillator having a driver and a resonator. The driver receives a supply voltage at a supply input and provides a drive output to drive the resonator to generate an oscillator output signal. A power converter receives an input voltage and generates the supply voltage to the supply input of the driver. The power converter varies the supply voltage based on an adjust command supplied to a command input of the power converter. A detector monitors a voltage level of the oscillator output signal. A controller sets the adjust command to the power converter to control the supply voltage to the supply input of the driver such that the voltage level of the oscillator output signal is set above a predetermined threshold voltage. A disable circuit disables the controller after the oscillator output signal is set at or above the predetermined threshold voltage.

DETAILED DESCRIPTION

This disclosure relates to a set point adjuster for an oscillator driver. Supply voltages applied to the driver can contribute to significant power loss in oscillator circuits that operate with the driver if the supply voltage is maintained at higher levels. If the supply voltage to the driver is reduced for example, power in the driver can be reduced. However, due to driver process variations (e.g., process variations affecting operating range of driver due to integrated circuit differences), if the supply voltage is reduced too low to conserve power in the driver, the oscillator can malfunction. The set point adjuster described herein utilizes automatic detection and control circuits to determine the minimum voltage setting that can be supplied to the driver to conserve driver power. This includes setting the voltage to a high enough voltage level that facilitates suitable driver operations that maintain circuit oscillation in view of process variations between different driver circuits and in view of variations over time that may result in the minimum threshold changing (e.g., with temperature).

In one example in such automated control and detection circuits, a circuit includes an oscillator having a driver and a resonator (e.g., crystal). A power converter receives an input voltage and generates the supply voltage to a supply input of the driver. The power converter varies the supply voltage based on an adjust command supplied to a command input of the power converter from a controller. A detector monitors a voltage level of the oscillator output signal where the controller sets the adjust command to the power converter based on the level of the oscillator output signal determined by the detector. The controller controls the supply voltage to the supply input of the driver such that the voltage level of the oscillator output signal is set at or above a predetermined threshold voltage. The predetermined threshold voltage can be dynamically adjusted to account for differing process conditions where the threshold determines the minimum supply voltage applied to the driver to conserve power while also setting a suitable operating voltage level high enough to maintain circuit oscillations. Various devices in the power converter can be selectively switched to adjust the voltage operating range of the converter. Substantially any power converter can be employed that can adjust its voltage based on a command input to increase or reduce supply voltage to the driver. These converters can include programmable linear regulators, switched-capacitor supplies, and inductive-based switching supplies, for example.

Figure 1:
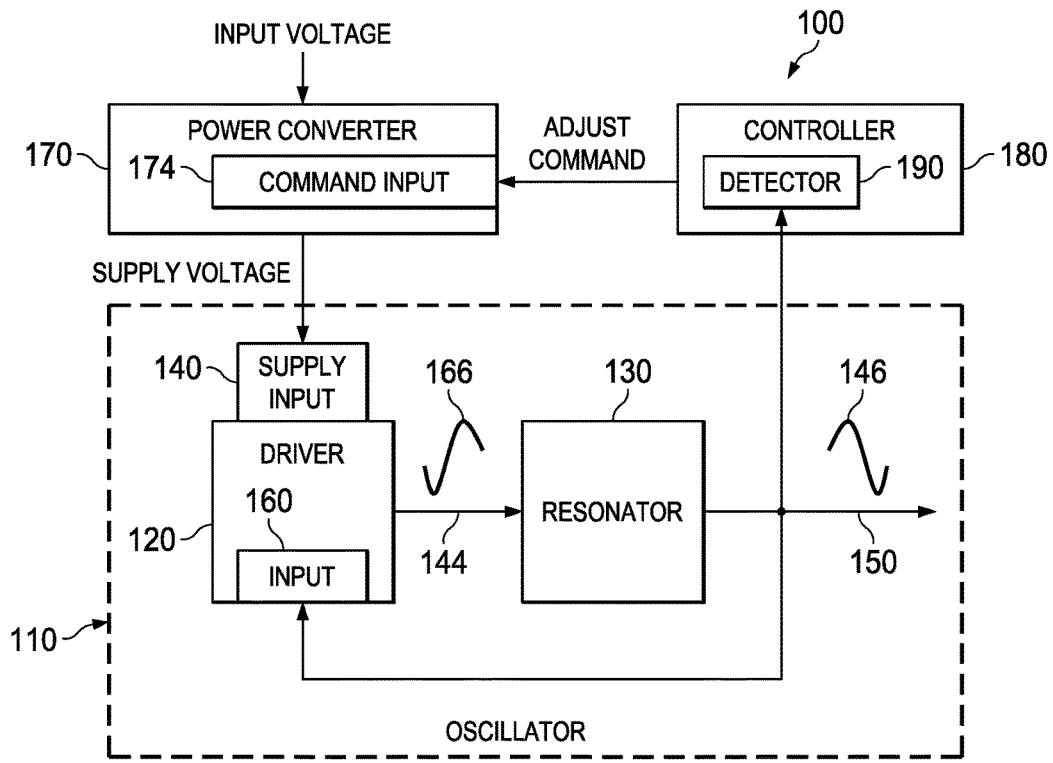
FIG. 1 illustrates a block diagram of an example circuit that provides set point adjustment for an oscillator driver.

FIG. 1 illustrates an example circuit 100 that provides set point adjustment for an oscillator driver. As used herein, the term circuit can include a collection of active and/or passive elements that perform a circuit function, such as an analog circuit, digital circuit or control circuit, for example. The term circuit can also include an integrated circuit where all the circuit elements are fabricated on a common substrate, for example. The circuit includes an oscillator 110 having a driver 120 and a resonator 130 (e.g., crystal). The driver 120 receives a supply voltage at a supply input 140 and provides a drive output 144 to drive the resonator 130 to generate an oscillator output signal 146 at output 150 of the resonator. The signal 146 is fed back to an input 160 of the driver 120 where the driver operates as an inverter to generate signal 166. A power converter 170 receives an input voltage and generates the supply voltage to the supply input 140 of the driver 120.

The power converter 170 varies the supply voltage based on an adjust command supplied to a command input 174 of the power converter from a controller 180. A detector 190 in the controller 180 monitors a voltage level of the oscillator output signal 146. The controller 180 sets the adjust command to the power converter 170 to control the supply voltage to the supply input 140 of the driver 120 such that the voltage level of the oscillator output signal is set at or above a predetermined threshold voltage. The predetermined threshold voltage can be dynamically adjusted (See e.g., FIG. 5) to account for differing process conditions where the threshold determines the minimum supply voltage applied to the driver 120 to conserve power while also setting a suitable operating voltage level high enough to maintain circuit oscillations in the oscillator 110. Also, the minimum threshold may change with time, and thus the circuit 100 can maintain the voltage level of the supply voltage at the minimum threshold even if that threshold changes over time. This is possible since the loop that controls to the minimum threshold may be operated more than once (e.g. it may be operated again if temperature changes). Furthermore, the controller 180 that operates the control loops described herein to find the minimum threshold can be a mixed signal (e.g., reads an analog input voltage and outputs a digital output adjust command).

In an example, the resonator 130 can be a crystal resonator, a micro-electromechanical system (MEMS) resonator, or an LC network resonator however substantially any type of resonator circuit can be employed. The power converter 170 can be substantially any type of regulated power supply that attempts to regulate a constant output supply voltage based on a given input voltage and the respective adjust command setting. The power converter 170 can be a switched capacitor power supply in one example or an inductor-based switching power supply that receives the input voltage and generates the supply voltage to the supply input 140 of the driver 120. In another example, the power converter 170 can be a linear regulator (e.g., low dropout regulator (LDO)) that receives the input voltage and generates the supply voltage to the supply input 140 of the driver 120.

If a linear regulator is employed as the power converter 170, the linear regulator can include a pass transistor device (See e.g., FIG. 4) to provide the supply voltage to the supply input 140 of the driver 120. The linear regulator can also include a leakage current generating device to supply current to operate a gate of the pass transistor device. In this configuration, gate leakage of the leakage current generating device supplies current to a diode to operate the gate of the pass transistor device. By using gate leakage to control current within the linear regulator, power in the regulator can further be conserved. A programmable switching device (see e.g., FIG. 4) can be provided to adjust a range of voltage levels for the power converter 170. The switching device can configure a number of series pass transistor devices, a number of series leakage current generating devices, or a number of series diodes in the linear regulator to adjust the voltage operations for the power converter 170 and in response to the adjust command. Further examples of the controller 180 and the detector 190 are illustrated and described below with respect to FIG. 5.

Figure 2:
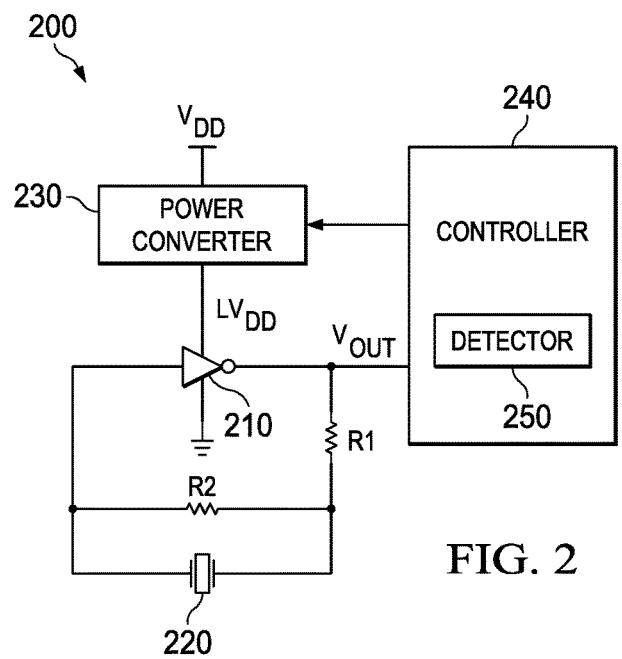
FIG. 2 illustrates a schematic block diagram of an example circuit that provides set point adjustment for a crystal oscillator driver.

FIG. 2 illustrates an example circuit 200 that provides set point adjustment for a crystal oscillator driver 210. The crystal oscillator driver 210 (also referred to as driver) is an inverter and drives its respective output via resistor R1 to one leg of a crystal 220. Another leg of the crystal 220 is coupled to an input of the driver 210. A resistor R2 may also be employed to promote oscillator stability in the circuit 200. An input voltage shown as VDD drives a power converter 230 which provides a supply voltage LVDD (e.g., Local VDD) to operate the driver 210. In one example, VDD may be greater than 1 volts (e.g., 1.2 volts) and LVDD may be less than 1 volts (e.g., 0.5 volts). A controller 240 adjusts the power converter 230 output setting for LVDD via the adjust command described herein (e.g., digital counter value setting power converter voltage level). A detector 250 monitors to oscillator voltage level shown as VOUT. Based on the detected level VOUT by the detector 250, the adjust command from the controller 240 can be set at a minimum level to conserve power in the driver 210 yet sustain suitable circuit oscillations in the circuit 200.

Figure 3:
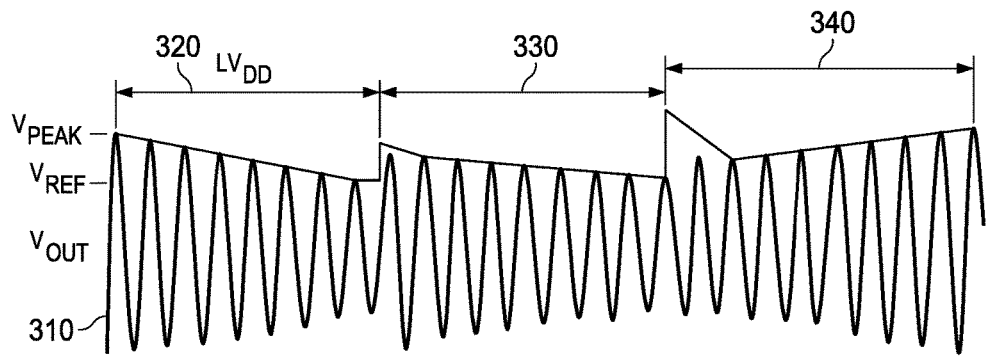
FIG. 3 illustrates example voltage settings for a crystal oscillator driver.

FIG. 3 illustrates example voltage settings for a crystal oscillator driver. A voltage waveform at 310 illustrates differing values of VOUT described above with respect to FIG. 2 based on different settings of LVDD which is the supply input to the driver described herein. At 320 and a given setting of LVDD, the voltage level of VOUT shown as VPEAK on the vertical axis falls below a minimum threshold setting shown as VREF on the vertical axis. At 330, LVDD is incrementally increased via an adjust command to the power converter yet VOUT still has a peak that falls below VREF. At 340, after another incremental adjustment to LVDD, VOUT stays above the threshold VREF. At this setting, LVDD is set at a minimum level to conserve power in the driver and set at a high enough level to maintain suitable oscillation. As will be described below with respect to FIG. 7, after the setting at 340, a disable circuit can shutoff the controller, detector and/or other circuits described herein to generate the adjust command to further conserver power in the circuit. It is noted that the control loop may be re-run as needed to respond to changing circuit conditions. Also, the time constant of the circuit, that is, the length of the times at 320, 330, and 340 measurement periods is adjustable over a wide range. This is unlike an analog-only system that do not employ digital controls in the controller and power converter. Thus, this type of digital control is more powerful and flexible since it can operate with a wide variety of resonators.

Figure 4:
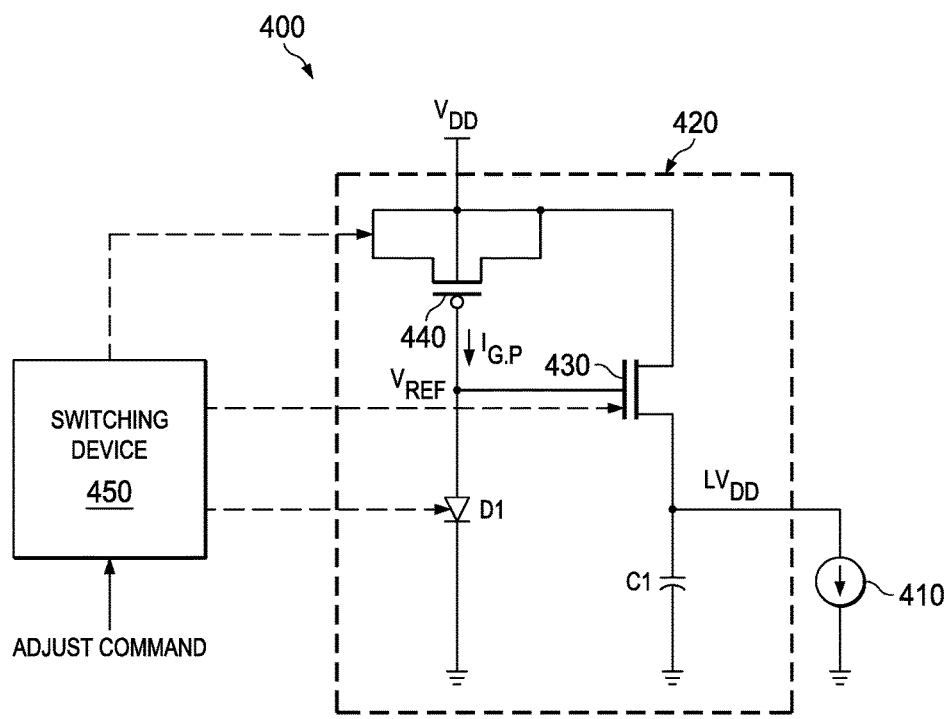
FIG. 4 illustrates a schematic diagram of a configurable power converter circuit that provides voltage adjustment for a crystal oscillator driver.

FIG. 4 illustrates a configurable power converter circuit 400 that provides set point adjustment for an oscillator driver. In this circuit example, the crystal oscillator and driver described herein are represented as load current 410 for illustrative purposes. A linear regulator 420 operating as the power converter described herein receives an input voltage VDD and generates the supply voltage LVDD to the supply input of the driver (See e.g., FIGS. 1 and 2). The linear regulator 420 includes a pass transistor device 430 to provide the supply voltage LVDD to the supply input of the driver represented as the current source 410. A capacitor C1 (or capacitors) may also be present to filter LVDD. A leakage current generating device 440 supplies current to a diode D1 to operate a gate of the pass transistor device 430. In this example, diode D1 is operatively coupled to the leakage current generating device 440 and to the gate of the pass transistor 430 in the linear regulator 420 to control the voltage level output of the regulator.

In order to maintain the lowest power levels in the linear regulator 420, gate leakage of the leakage current generating device 440 supplies current to the diode D1 to operate the gate of the pass transistor device 430. A programmable switching device 450 can be employed to adjust a range of voltage operations for the linear regulator. The switching device 450 can receive adjust commands and can be programmed via the controller, factory setting commands supplied to the controller, onsite user commands supplied to the controller, and/or via remote network control commands to the controller, for example. The switching device 450 can include user programmable switches that enable or disable one or more series and/or parallel devices in the linear regulator 420 to control the range of operations of the regulator. Disabling can include closing a switch that shorts a series device whereas enabling can include opening a switch to effectively insert the series device into the circuit. For example, the switching device 450 can configure a number of series pass transistor devices 430 or a number of series leakage current generating devices 440 by enabling or disabling control switches across the respective series devices. Programming can also include switching a number of series or parallel diodes for D1 to adjust the range of current or voltage operations for the linear regulator 420.

Figure 5:
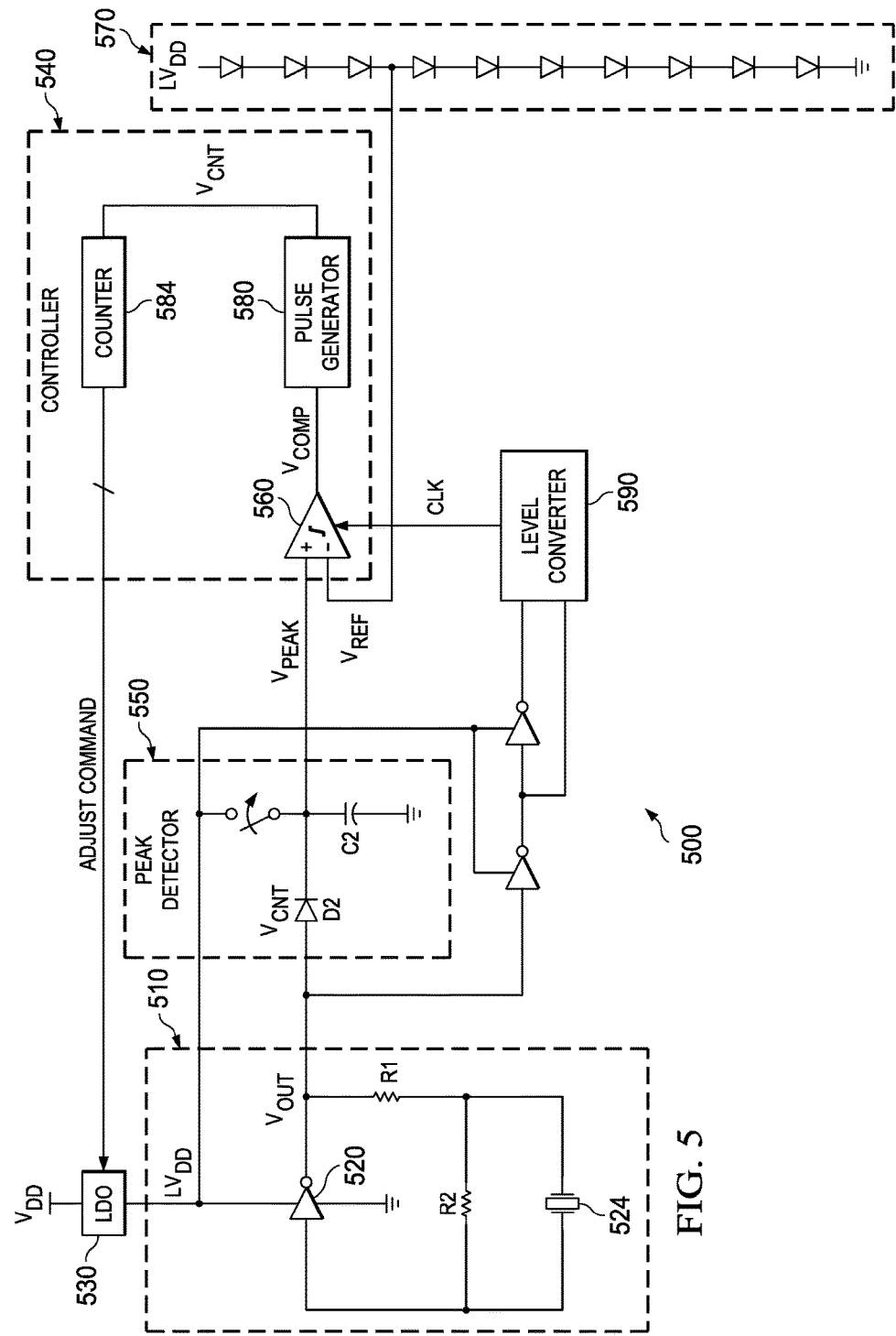
FIG. 5 illustrates an example a control circuit that provides set point adjustment for a crystal oscillator driver.

FIG. 5 illustrates an example a control circuit 500 that provides set point adjustment for a crystal oscillator driver. The circuit 500 includes an oscillator 510 having a driver 520 and a crystal resonator 524. Resistors R1 and R2 can be employed as previously described. The driver 520 receives a supply voltage LVDD at a supply input and provides a drive output VOUT to drive the resonator 524 to generate an oscillator output signal. A power converter 530 shown as a linear low dropout regulator (LDO) receives an input voltage VDD and generates the supply voltage LVDD to the supply input of the driver 520. The power converter 530 varies the supply voltage LVDD based on an adjust command supplied to a command input of the power converter from a controller 540. A detector 550 monitors a voltage level of the oscillator output signal VOUT. The controller 540 sets the adjust command to the power converter 530 to control the supply voltage to the supply input of the driver 520 such that the voltage level of the oscillator output signal VOUT is set above a predetermined threshold voltage.

As shown, the detector 550 can include a diode D2 to rectify the alternating current (AC) voltage and a capacitor C2 to store a sampled charge from the rectified AC voltage. The controller 540 includes a comparator 560 that compares the stored sampled charge on C2 from the rectified AC voltage to the predetermined threshold voltage shown as VREF that is received at a reference input of the comparator to determine if the rectified AC voltage shown as VPEAK is above the predetermined threshold voltage. The predetermined threshold voltage can be set via a programmable set of series diodes 570 that establish the threshold voltage based on the number of series diodes selected. The output of the comparator 560 drives a pulse generator 580 in the controller 540. The pulse generator 580 in turn drives a counter 584 that increments the adjust command applied to the power converter 530 (e.g., digital count value representing number of series elements in the power converter to select or deselect). A level converter 590 can be employed to provide suitable operating voltages for the comparator 560 based on boosting signals generated from the lower LVDD supply.

Figure 6:
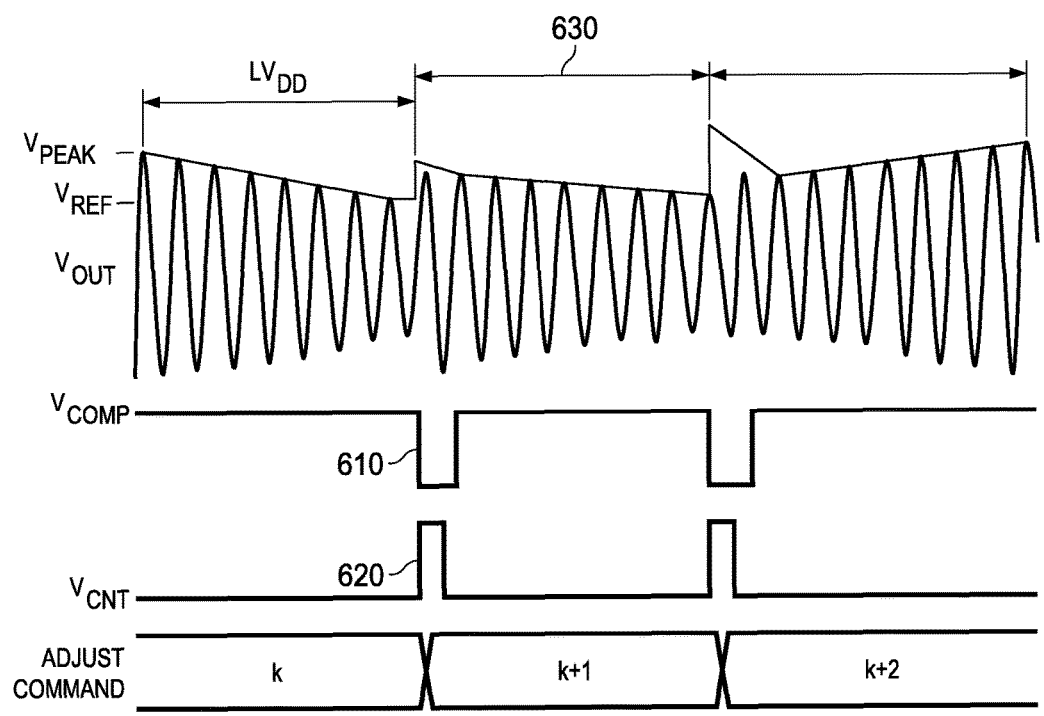
FIG. 6 illustrates example timing and control diagrams for the control circuit depicted in FIG. 5.

FIG. 6 illustrates example timing and control diagrams for the control circuit depicted in FIG. 5. As shown, each time a comparator output fires such as shown at 610, a pulse VCNT is generated at 620 which causes in incremental increase in adjust command values which are represented as counter value K, K+1, K+2 and so forth. Thus, as for each pulse of VCNT, LVDD is increased such as shown at 630. The value of LVDD can continue to be incrementally increased until the comparator described above no longer detects that VPEAK has fallen below the threshold voltage set by VREF.

Figure 7:
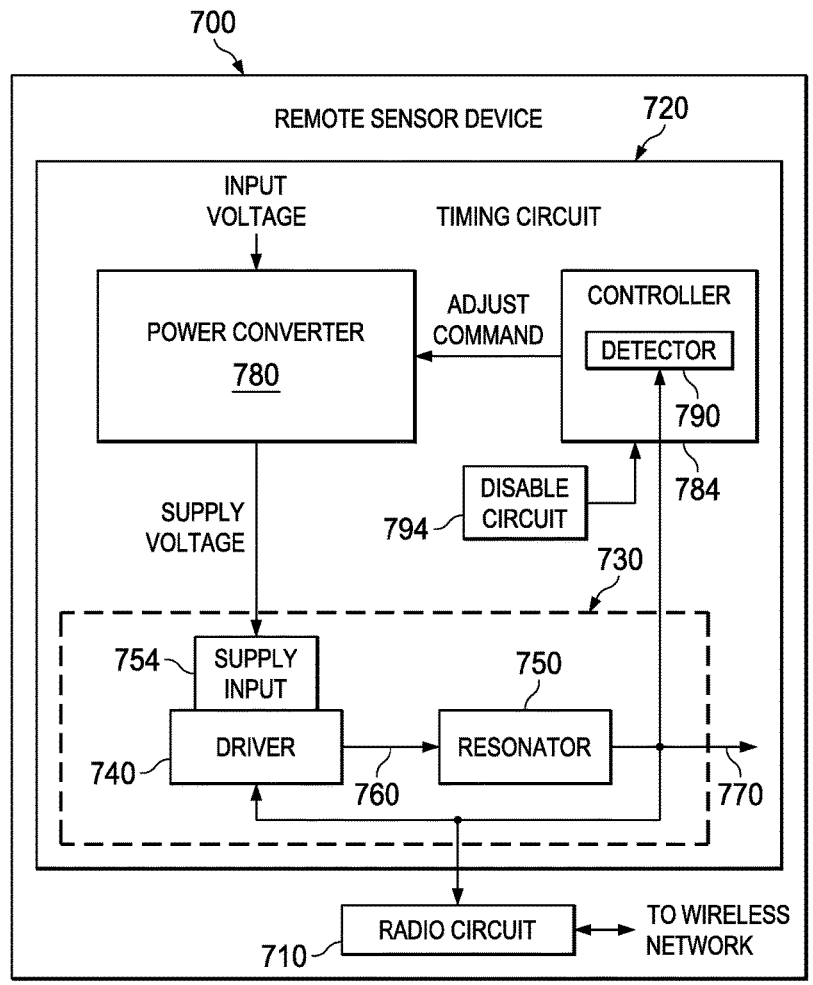
FIG. 7 illustrates a block diagram of an example apparatus that provides set point adjustment for an oscillator driver in a remote sensor device.

FIG. 7 illustrates an example apparatus that provides set point adjustment for an oscillator driver in a remote sensor device 700. The remote sensor device 700 (e.g., sensor, data collector, or controllable output device) includes a radio circuit 710 to communicate with the device via a wireless network connection. The remote sensor device 700 includes a timing circuit 720 to operate the device. The timing circuit 720 includes an oscillator 730 having a driver 740 and a resonator 750. Although the resonator 750 is shown within the timing circuit 720 in this example, it can be located off-chip, for example (e.g., resonator supplying its output to timing circuit integrated circuit). The driver 740 receives a supply voltage at a supply input 754 and provides a drive output 760 to drive the resonator 750 to generate an oscillator output signal at 770. A power converter 780 receives an input voltage and generates the supply voltage to the supply input 754 of the driver 760. The power converter 780 varies the supply voltage based on an adjust command supplied to a command input of the power converter from a controller 784. A detector 790 monitors a voltage level of the oscillator output signal. The controller 784 sets the adjust command to the power converter 780 to control the supply voltage to the supply input 754 of the driver 740 such that the voltage level of the oscillator output signal is set above a predetermined threshold voltage. A disable circuit 794 can be provided to disable the controller 784, detector 790 and or other circuits after the oscillator output signal is set above the predetermined threshold voltage to further conserve power in the circuit 720 after the setting has been made.

Figure 8:
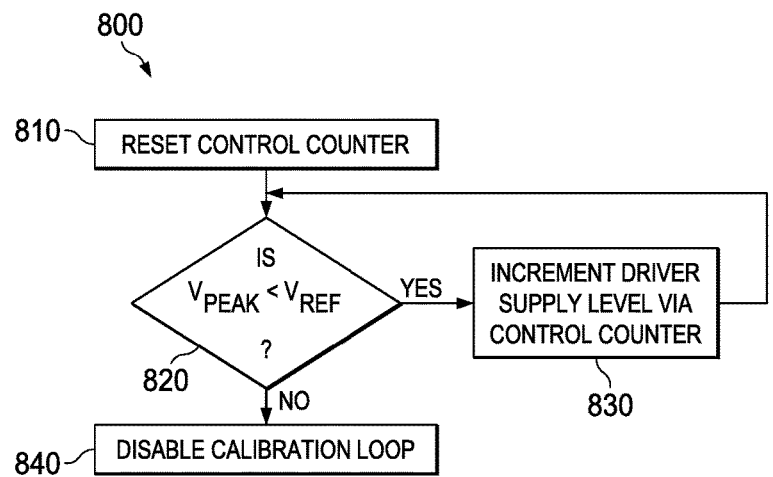
FIG. 8 is a flow diagram of an example method that provides set point adjustment for an oscillator driver.

In view of the foregoing structural and functional features described above, an example method will be better appreciated with reference to FIG. 8. While, for purposes of simplicity of explanation, the method is shown and described as executing serially, it is to be understood and appreciated that the method is not limited by the illustrated order, as parts of the method could occur in different orders and/or concurrently from that shown and described herein. Such method can be executed by various components configured in an IC, controller, or a processor, for example.

FIG. 8 is an example method 800 that provides set point adjustment for an oscillator driver. At 810, initial counter values are reset for setting the adjustment command described herein (e.g., via controller 180 of FIG. 1). At 820, the method 800 includes monitoring a voltage level of an oscillator output signal (e.g., via detector 190 of FIG. 1). The oscillator output signal is generated by an oscillator having a resonator and a driver as described herein. Also at 820, the method 800 includes comparing the voltage level of the oscillator output signal to a predetermined minimum threshold voltage (e.g., via comparator 560 of FIG. 5). If the oscillator signal falls below VREF at 820, the method proceeds to 830 and increments a counter value to control a supply input voltage to the driver such that the voltage level of the oscillator output signal is set above the predetermined minimum threshold voltage to sustain the oscillator output signal and to mitigate power in the driver (e.g., via controller 180 and power converter 170 of FIG. 1). If the oscillator output remains above the reference voltage at 820, the method 800 can also include disabling the controlling of the supply input voltage to the driver at 840 after the oscillator output signal is set above the predetermined threshold voltage (e.g., via disable circuit 794 of FIG. 7). Although not shown, the method 800 can also include configuring a number of series pass transistor devices, a number of series leakage current generating devices, or a number of diodes in series with the leakage current generating device of the power converter to adjust the voltage range of the supply input voltage to the driver. The method 800 can also include generating a number of pulses based on the comparing of the voltage level of the oscillator output signal and counting the number of pulses to adjust the voltage range of the supply input voltage to the driver.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
an oscillator having a driver and a resonator, the driver receiving a supply voltage at a supply input and providing a drive output to drive the resonator to generate an oscillator output signal;
a power converter that receives an input voltage and generates the supply voltage to the supply input of the driver, the power converter varies the supply voltage based on an adjust command supplied to a command input of the power converter, wherein the power converter is a linear regulator, a switched capacitor power supply, or an inductor-based switching power supply that receives the input voltage and generates the supply voltage to the supply input of the driver;
a detector to monitor a voltage level of the oscillator output signal; and
a controller to set the adjust command to the power converter to control the supply voltage to the supply input of the driver such that the voltage level of the oscillator output signal is set at or above a predetermined threshold voltage.

2. The circuit of claim 1, wherein the linear regulator includes a pass transistor device to provide the supply voltage to the supply input of the driver, a leakage current generating device to supply current to operate a gate of the pass transistor device, and a diode coupled to the leakage current generating device to set the voltage on the gate of the pass transistor device.

3. The circuit of claim 2, wherein the switching device configures a number of series pass transistor devices, a number of series leakage current generating devices, or a number of diodes in series with the leakage current generating device to adjust the voltage range of the linear regulator.

4. A circuit, comprising:
an oscillator having a driver and a resonator, the driver receiving a supply voltage at a supply input and providing a drive output to drive the resonator to generate an oscillator output signal;
a power converter that receives an input voltage and generates the supply voltage to the supply input of the driver, the power converter varies the supply voltage based on an adjust command supplied to a command input of the power converter;
a detector to monitor a voltage level of the oscillator output signal, wherein the detector further comprises an alternating current (AC) voltage peak detector that includes a diode to rectify the AC voltage and a capacitor to store a sampled charge from the rectified AC voltage; and
a controller to set the adjust command to the power converter to control the supply voltage to the supply input of the driver such that the voltage level of the oscillator output signal is set at or above a predetermined threshold voltage.

5. The circuit of claim 4, wherein the controller further comprises a comparator that compares the stored sampled charge from the rectified AC voltage to the predetermined threshold voltage that is received at a reference input of the comparator to determine if the rectified AC voltage is above the predetermined threshold voltage.

6. The circuit of claim 5, wherein the predetermined threshold voltage is set via a programmable set of series diodes that establish the threshold voltage based on the number of series diodes selected.

7. The circuit of claim 5, wherein the output of the comparator drives a pulse generator in the controller, the pulse generator drives a counter that increments the adjust command applied to the power converter.

8. A circuit, comprising:
an oscillator having a driver and a resonator, the driver receiving a supply voltage at a supply input and providing a drive output to drive the resonator to generate an oscillator output signal;
a power converter that receives an input voltage and generates the supply voltage to the supply input of the driver, the power converter varies the supply voltage based on an adjust command supplied to a command input of the power converter;
a detector to monitor a voltage level of the oscillator output signal;
a controller to set the adjust command to the power converter to control the supply voltage to the supply input of the driver such that the voltage level of the oscillator output signal is set at or above a predetermined threshold voltage; and
a disable circuit to disable the controller and the detector after the oscillator output signal is set above the predetermined threshold voltage.

9. A method, comprising:
monitoring a voltage level of an oscillator output signal, the oscillator output signal is generated by an oscillator having a resonator and a driver;
comparing the voltage level of the oscillator output signal to a predetermined minimum threshold voltage;
controlling a supply input voltage to the driver such that the voltage level of the oscillator output signal is set at or above the predetermined minimum threshold voltage to sustain the oscillator output signal and to mitigate power in the driver; and
configuring a number of series pass transistor devices, a number of series leakage current generating devices, or a number of diodes in series with the leakage current generating device of a power converter to adjust the voltage range of the supply input voltage to the driver.

10. A method, comprising:
monitoring a voltage level of an oscillator output signal, the oscillator output signal is generated by an oscillator having a resonator and a driver;
comparing the voltage level of the oscillator output signal to a predetermined minimum threshold voltage;
controlling a supply input voltage to the driver such that the voltage level of the oscillator output signal is set at or above the predetermined minimum threshold voltage to sustain the oscillator output signal and to mitigate power in the driver; and
generating a number of pulses based on the comparing of the voltage level of the oscillator output signal and counting the number of pulses to adjust the voltage range of the supply input voltage to the driver.

11. An apparatus, comprising:
a remote sensor device that includes a radio circuit to communicate with the device via a wireless network connection, the remote sensor device includes a timing circuit to operate the device, the timing circuit comprising:
an oscillator having a driver and a resonator, the driver receiving a supply voltage at a supply input and providing a drive output to drive the resonator to generate an oscillator output signal;
a power converter that receives an input voltage and generates the supply voltage to the supply input of the driver, the power converter varies the supply voltage based on an adjust command supplied to a command input of the power converter;
a detector to monitor a voltage level of the oscillator output signal;
a controller to set the adjust command to the power converter to control the supply voltage to the supply input of the driver such that the voltage level of the oscillator output signal is set at or above a predetermined threshold voltage; and
a disable circuit to disable the controller after the oscillator output signal is set above the predetermined threshold voltage.

12. The apparatus of claim 11, wherein the detector further comprises an alternating current (AC) voltage peak detector that includes a diode to rectify the AC voltage and a capacitor to store a sampled charge from the rectified AC voltage.

13. The apparatus of claim 12, wherein the controller further comprises a comparator that compares the stored sampled charge from the rectified AC voltage to the predetermined threshold voltage that is received at a reference input of the comparator to determine if the rectified AC voltage is above the predetermined threshold voltage.

14. The apparatus of claim 13, wherein the predetermined threshold voltage is set via a programmable set of series diodes that establish the threshold voltage based on the number of series diodes selected.

15. The apparatus of claim 13, wherein the output of the comparator drives a pulse generator in the controller, the pulse generator drives a counter that increments the adjust command applied to the power converter.

16. The circuit of claim 11, wherein the disable circuit to disables the detector after the oscillator output signal is set above the predetermined threshold voltage.

* * * * *